(12) United States Patent
Chen et al.

(10) Patent No.: US 8,528,438 B2
(45) Date of Patent: Sep. 10, 2013

(54) ROBOTIC ARM FOR TRANSPORTING SUBSTRATE IN ULTRAHIGH VACUUM

(75) Inventors: Hsien-Chung Chen, Longtan Township, Taoyuan County (TW); Kun-Feng Huang, Yongkang (TW)

(73) Assignee: Chung-Shan Institute of Science and Technology, Armaments Bureau, Ministry of National Defense, Taoyuan County (TW)

( * ) Notice: Subject to any disclaimer, the term of this patent is extended or adjusted under 35 U.S.C. 154(b) by 659 days.

(21) Appl. No.: 12/626,611

(22) Filed: Nov. 25, 2009

(65) Prior Publication Data
US 2011/0120251 A1 May 26, 2011

(51) Int. Cl.
*B25J 17/00* (2006.01)
*B25J 18/00* (2006.01)

(52) U.S. Cl.
USPC ................. 74/490.01; 414/744.3; 414/744.5; 414/744.6; 901/15

(58) Field of Classification Search
USPC ................. 414/744.3, 744.5, 744.6; 901/15; 74/490.01
See application file for complete search history.

(56) References Cited

U.S. PATENT DOCUMENTS

| | | | | |
|---|---|---|---|---|
| 5,456,561 | A | * | 10/1995 | Poduje et al. ............. 414/744.5 |
| 7,449,807 | B2 | * | 11/2008 | Johnson ....................... 310/103 |
| 2007/0280813 | A1 | * | 12/2007 | Nakamura et al. ......... 414/744.5 |
| 2009/0035114 | A1 | * | 2/2009 | Uratani et al. ............... 414/591 |

* cited by examiner

*Primary Examiner* — Scott Lowe

(57) ABSTRACT

The invention provides a robotic arm for transporting a substrate in an ultrahigh vacuum including a carrier module and a drive module. The drive module includes a magnetic coupling, a first transmission module, a second transmission module, and a third transmission module. The magnetic coupling includes an inner shaft and an outer shaft. The first transmission module drives the first active unit of the magnetic coupling to turn a first passive unit of the inner shaft by magnetic force. The second transmission module drives the second active unit of the magnetic coupling to turn a second passive unit of the outer shaft by magnetic force. The third transmission module drives the magnetic coupling and the carrier module to perform vertical movement. The carrier module will achieve rotational motion or extending motion when the inner shaft and the outer shaft are driven by the first transmission module and the second transmission module of the drive module.

7 Claims, 6 Drawing Sheets

ROBOTIC ARM FOR TRANSPORTING SUBSTRATE IN ULTRAHIGH VACUUM

BACKGROUND OF THE INVENTION

1. Field of the Invention

The invention relates to a robotic arm, and more particularly, to a robotic arm for transporting a substrate in an ultrahigh vacuum capable of performing rotation without any angle limitations and suitable for high pressure equipment and high corrosiveness environment.

2. Description of the Prior Art

With the development of the technology, the size of the electronic device is continuously shrunk, and the circuit becomes more and more complicated, additionally, the requirement and standard for the cleanness in various optoelectronic and semiconductor device manufacturing processes are also increased. In general, there are several indexes to evaluate the technology quality of the electrical device, such as the number of defects, the concentration of impurities, and the flatness of surface. Therefore, in order to increase the yield and production capacity, the automatic manufacturing process equipment must strictly control the amount of particles in the clean room, and the equipment for ultrahigh vacuum ($10^{-7}$ Torr) or special gas processing should be also strictly controlled.

Please refer to FIG. 1. FIG. 1 shows a scheme diagram of a vacuum interface 22 of a conventional robotic arm. As shown in FIG. 1, the vacuum interface 22 includes ferrofluidic seals 220, an inner shaft 222, an outer shaft 224, an adapter 226, and a bellows 24.

In general, the motion of a substrate transporting arm has three degrees of freedom, such as rotation, extension, and lifting. Conventionally, at least two motors are needed to drive the robotic arm to perform the above-mentioned movements of three degrees of freedom, and at least one motor is set on the rotation component. It is hard for the rotation component to perform a rotation of large angle due to the wiring of the electricity and signal lines, and it is also hard to achieve dynamic balance of the rotation component. Moreover, because the mass of the motor will increase the moment of inertia of the rotation component, when the conventional robotic arm rotates, many drawbacks will be generated, such as poor rigidity, slow transient response, and low rotation speed.

Additionally, since the conventional robotic arm uses the ferrofluidic seals 220 as rotary feedthrough interface, there is a lot of friction within seals and start-up torque is very high due to friction. Besides, the vapor pressure of ferrofluid introduces the risk of molecular contamination and also limits the degree of vacuum. In fact, the ferrofluidic seals need to be periodically maintained, repaired, and replaced. Especially, when the robotic arm is used in a special gas environment, a special ferrofluidic seals is needed, so that the cost of the robotic arm is increased.

SUMMARY OF THE INVENTION

Therefore, a scope of the invention is to provide a robotic arm for transporting a substrate in an ultrahigh vacuum, the robotic arm can be used in a special environment of ultrahigh vacuum, high pressure, or special corrosive gas, to solve the above-mentioned problems in prior arts.

According to an embodiment, the robotic arm for transporting a substrate in an ultrahigh vacuum of the invention includes a carrier module and a drive module. The drive module includes a magnetic coupling, a first transmission module, a second transmission module, and a third transmission module. The magnetic coupling includes an inner shaft and an outer shaft, and is used for driving the carrier module. The first transmission module is used for driving the first active unit of the magnetic coupling to turn a first passive unit of the inner shaft by magnetic force. The second transmission module is used for driving the second active unit of the magnetic coupling to turn a second passive unit of the outer shaft by magnetic force. The third transmission module is used for driving the magnetic coupling to perform vertical movement.

Wherein, when the inner shaft and the outer shaft are driven by the first transmission module and the second transmission module of the drive module, the carrier module is driven to perform rotational or extending motion. In practical applications, the rotation of the carrier module is driven by the drive module when the inner shaft and the outer shaft rotate at the same time. And, when the inner shaft is fixed and the outer shaft rotates, the upper arm and the lower arm of the carrier module perform relative movements of the same angle in opposite directions, so that an end effector on the carrier module will perform the extending/retracting motion along a fixed direction. Additionally, the first transmission module, the second transmission module and the third transmission module are set on a bottom fixing mechanism.

Above all, the invention provides a robotic arm for transporting a substrate in an ultrahigh vacuum which can provides movements of three degrees of freedom including rotation, extension, and lifting. Since the inner shaft and the outer shaft of the magnetic coupling in the invention are coaxially designed, therefore, the motors can be set on the non-rotation component, and the magnetic coupling is driven through the spline by the motor, so that the robotic arm can perform the extension and the rotation without any angle limitations. Additionally, the invention uses magnetic coupling without any feedthrough shafts to obtain complete hermetic volume, so that the ultrahigh vacuum and cleanness can be assumed, and the reliability can be also increased and the maintaining time and cost can be also reduced.

The objective of the present invention will no doubt become obvious to those of ordinary skill in the art after reading the following detailed description of the preferred embodiment, which is illustrated in the various figures and drawings.

BRIEF DESCRIPTION OF THE APPENDED DRAWINGS

DETAILED DESCRIPTION OF THE INVENTION

Figure 1:
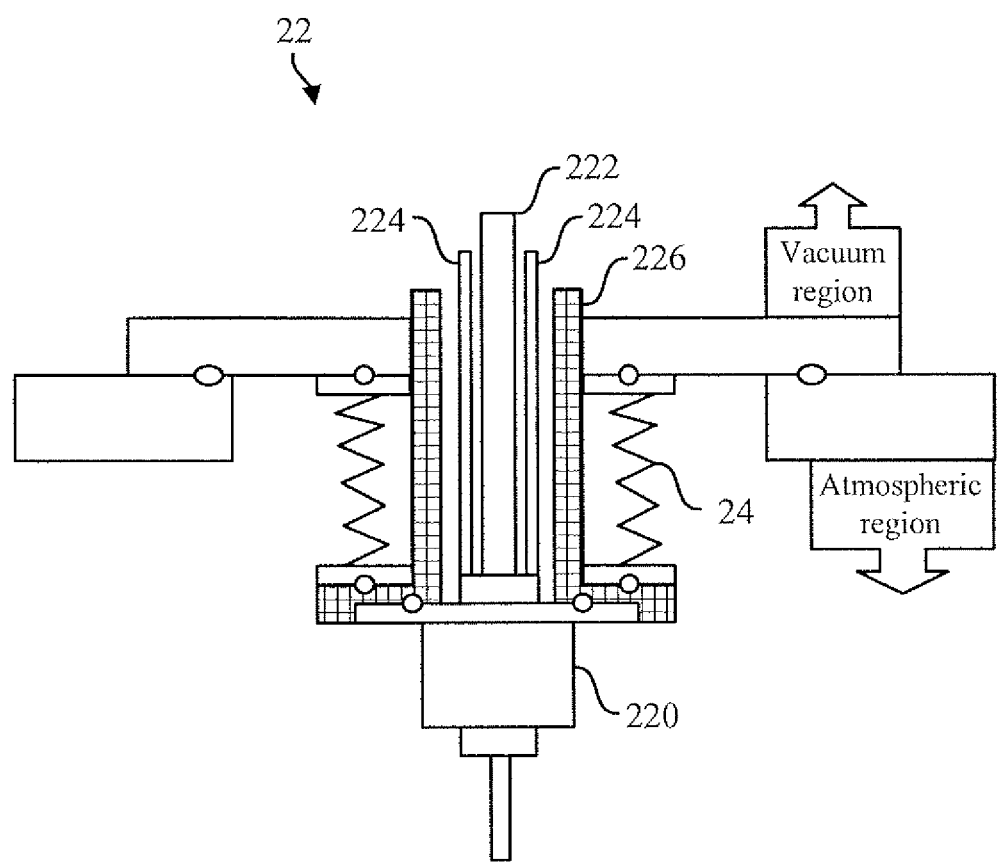
FIG. 1 shows a scheme diagram of a vacuum interface of a conventional robotic arm.
Figure 2:
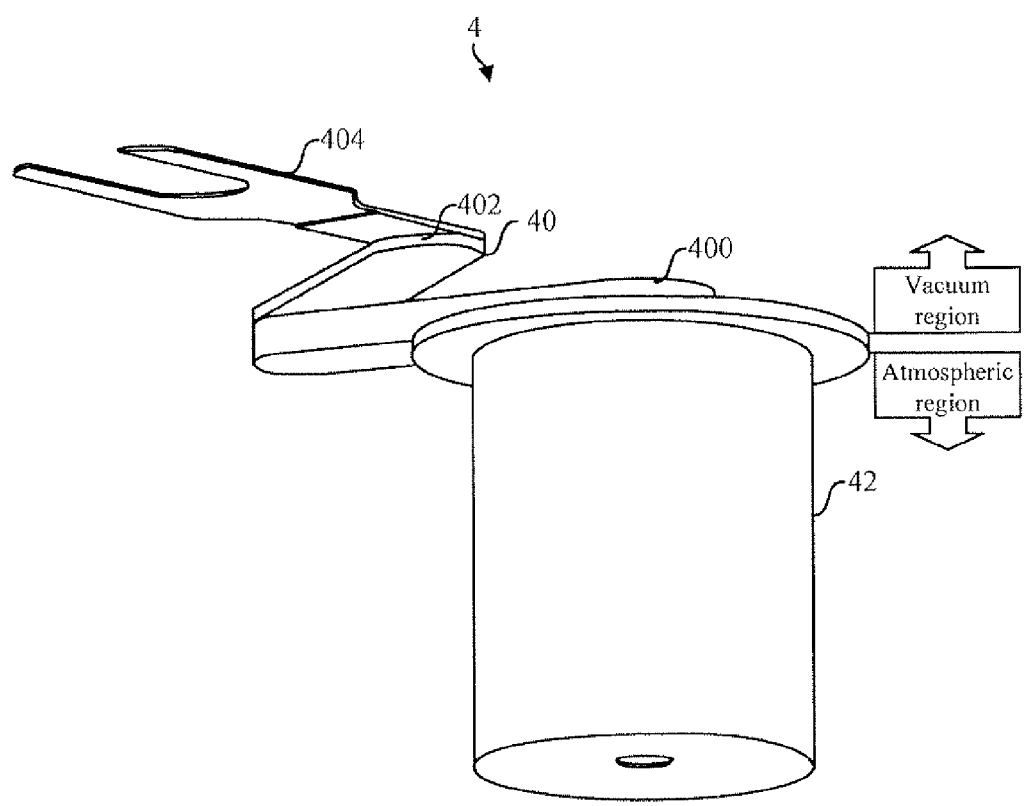
FIG. 2 shows a scheme diagram of a robotic arm for transporting a substrate in an ultrahigh vacuum in an embodiment of the invention.

Please refer to FIG. 2. FIG. 2 shows a scheme diagram of a robotic arm 4 for transporting a substrate in an ultrahigh vacuum in an embodiment of the invention. As shown in FIG. 2, the robotic arm 4 includes a carrier module 40 and a drive module 42. The carrier module 40 includes a lower arm 400, an upper arm 402, and an end effector 404. The drive module 42 is coupled to the carrier module 40, and used for driving the carrier module 40. In practical applications, the mechanism and design of the end effector 404 can be modified according to different substrates (e.g., a wafer or a liquid crystal display panel) carried by the carrier module 40.

Figure 3A:
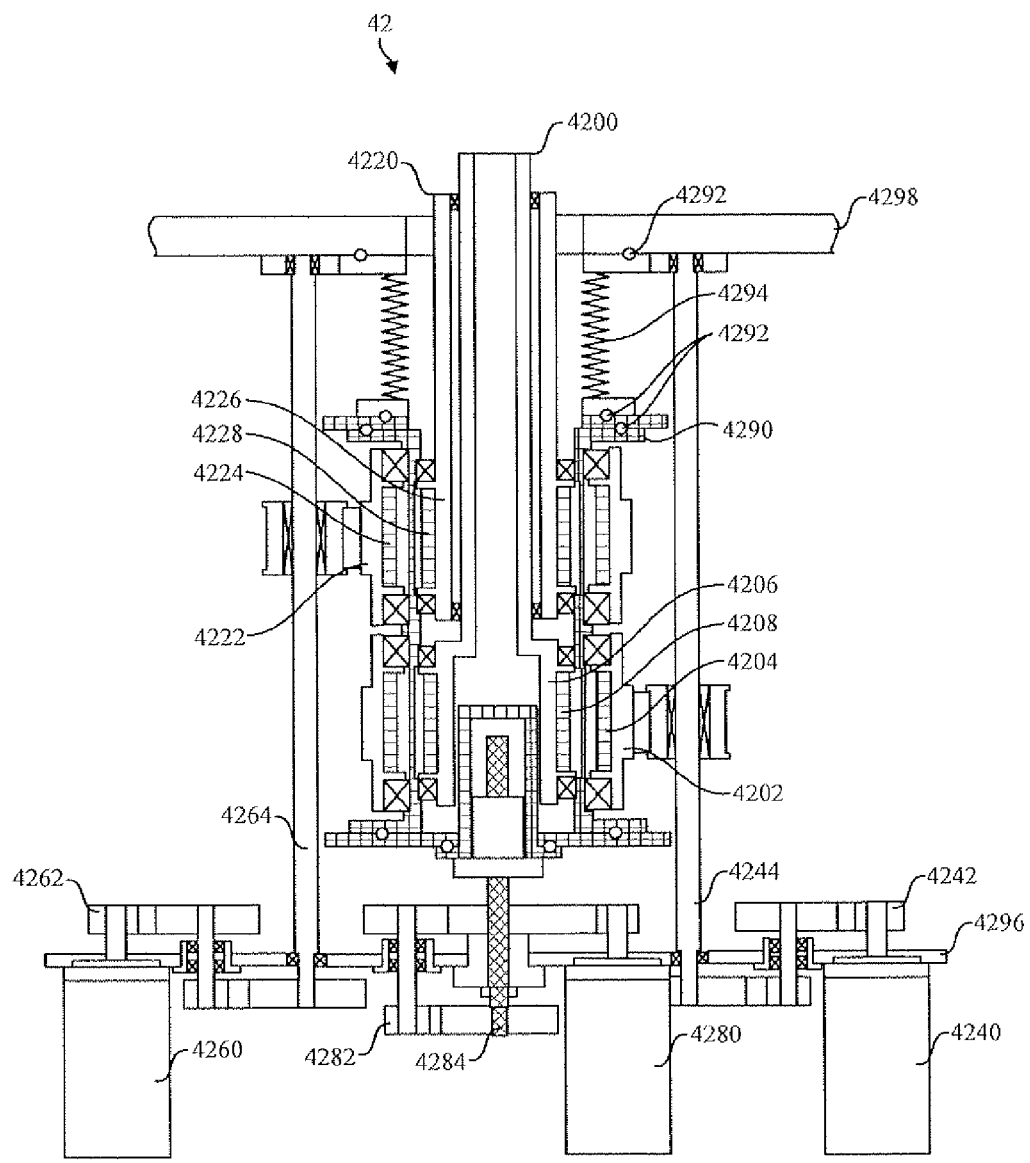
FIG. 3A shows a cross-sectional view of the drive module 42 in FIG. 2.
Figure 3B:
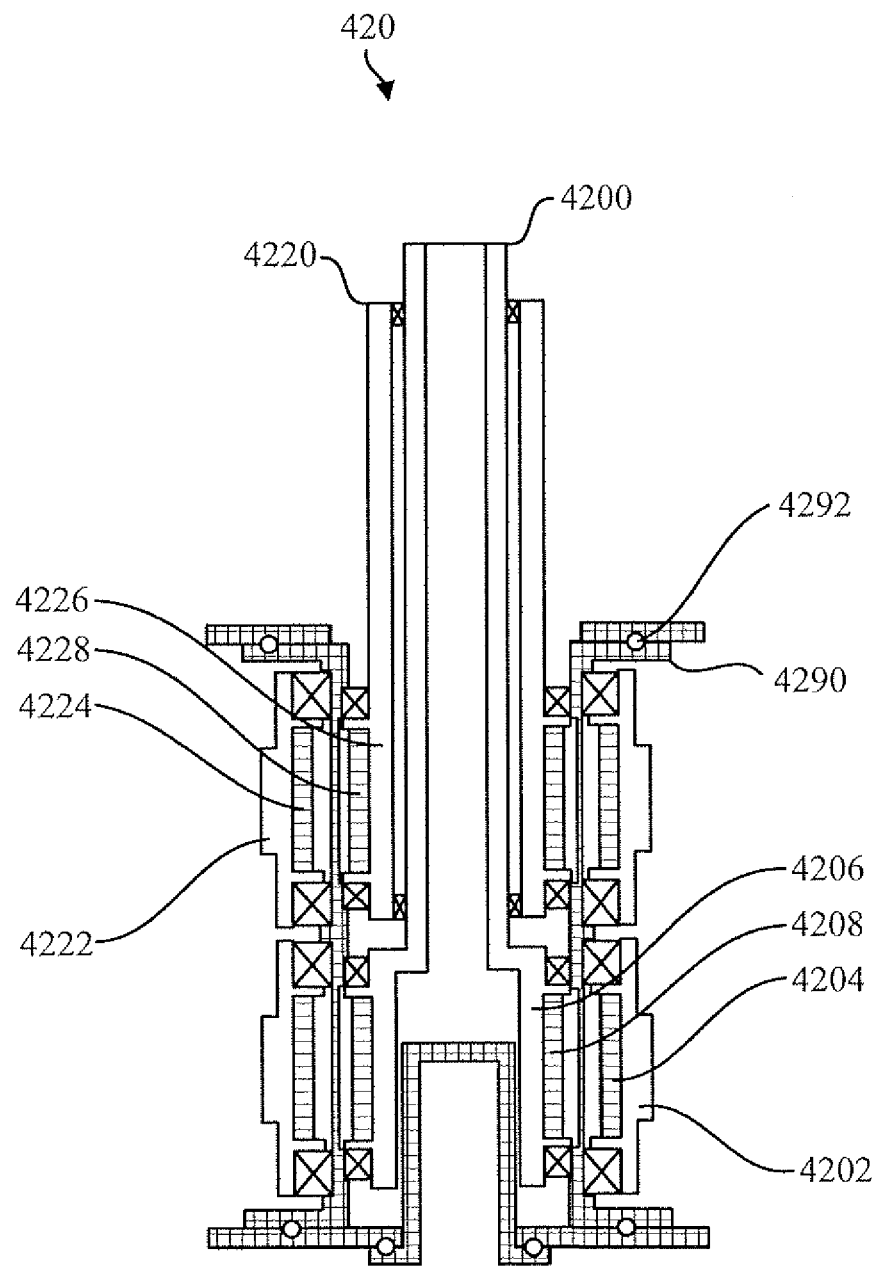
FIG. 3B shows a scheme diagram of a magnetic coupling 420 in FIG. 3A.
Figure 3C:
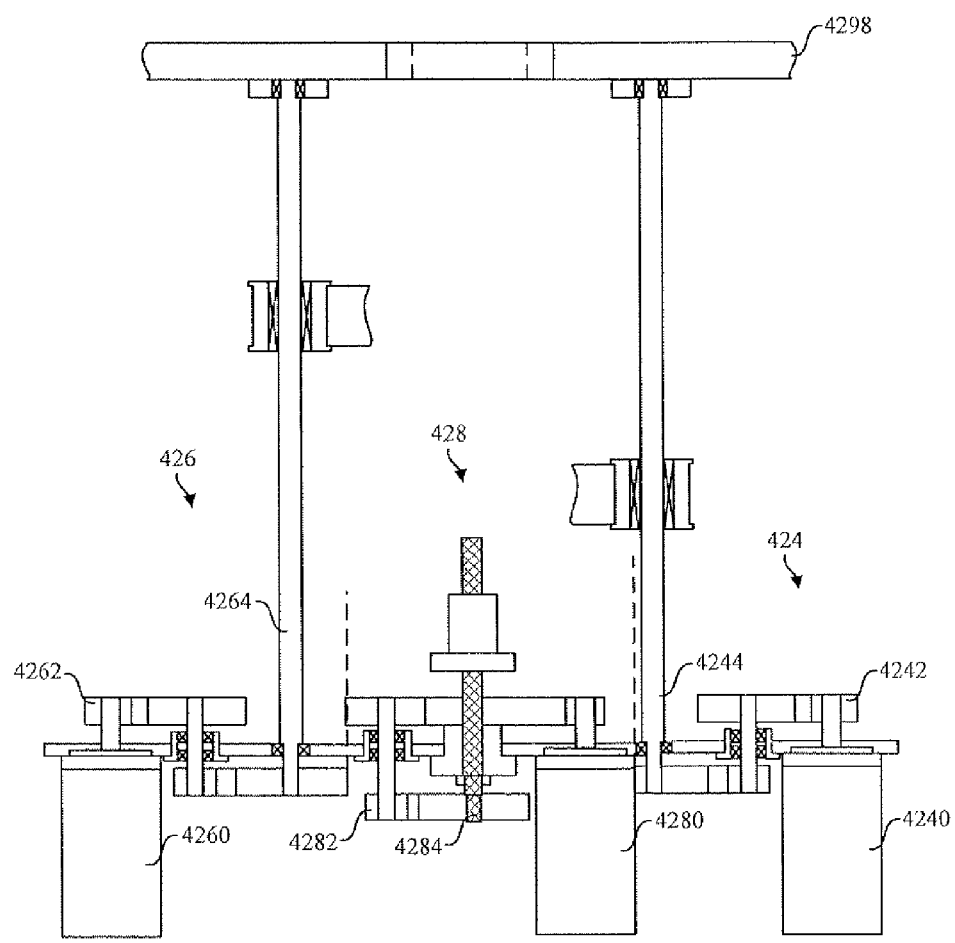
FIG. 3C shows a scheme diagram of the three transmission modules in FIG. 3A.

Please refer to FIG. 3A to FIG. 3C. FIG. 3A shows a cross-sectional view of the drive module 42 in FIG. 2; FIG. 3B shows a scheme diagram of a magnetic coupling 420 in FIG. 3A; FIG. 3C shows a scheme diagram of the three transmission modules in FIG. 3A. As shown in FIG. 3A, the drive module 42 includes a magnetic coupling 420, a first transmission module 424, a second transmission module 426, and a third transmission module 428. Wherein, the first transmission module 424, the second transmission module 426 and the third transmission module 428 are fixedly set on a bottom fixing mechanism 4296.

Since the motors are all set on the fixing mechanism in this invention, the rotation component of the robotic arm can be symmetrically arranged to improve dynamic balance. Therefore, the invention can increase the speed of the motion (rotation or extension) of the robotic arm. Also, because there is no motor set on the rotation component, the moment of inertia of the rotation component can be lowered and thus the motion control of the robotic arm becomes simpler. In addition to low moment of inertia, there is no friction loss with magnetic force transmission, the power of motors used in this invention can be decreased, and thus both of the weight and cost of the robotic arm are reduced.

In this embodiment, as the torque exceeds the maximum loading of the magnetic coupling 420, it can only generate a slip between the poles of magnetic coupling 420, and will not damage the structure of robotic arm. And, since magnetic force (non-contact force) is used for power transmission and there is no need of feedthrough shafts, therefore, a totally sealed volume can be easily achieved for ultrahigh vacuum.

The magnetic coupling 420 includes an inner shaft 4200, an outer shaft 4220, a first active unit 4202, a second active unit 4222, a first passive unit 4206, a second passive unit 4226, and a diaphragm 4290. The first passive unit 4206 is set on an outer surface of the inner shaft 4200, and the second passive unit 4226 is set on an outer surface of the outer shaft 4220. The magnetic components 4204, 4208, 4224, 4228 are embedded into the first active unit 4202, the second active unit 4222, the first passive unit 4206, the second passive unit 4226 respectively, so that each the first passive unit 4206 and the second passive unit 4226 can be driven by the first active unit 4202 and the second active unit 4222 according to magnetic force. In fact, the magnetic component can be an electromagnet or a permanent magnet, but not limited to these cases.

The diaphragm 4290 is used as a separator between the first active unit 4202 and first passive unit 4206 and between the second active unit 4222 and the second passive unit 4226, so that the air can be kept outside the diaphragm 4290. In practical applications, the diaphragm 4290 can be a non-magnetic component.

A bellows 4294 is used as a vacuum interface between the diaphragm 4290 and an upper fixing mechanism 4298. Additionally, O-rings 4292 are used between the diaphragm 4290 and the bellows 4294 to assure air tightness.

The first transmission module 424 is used for driving the first active unit 4202 of the magnetic coupling 420 to turn the first passive unit 4206 of the inner shaft 4200 by magnetic force. The first transmission module 424 includes a first motor 4240, at least one first transmission unit 4242 and at least one first spline 4244. The first transmission unit 4242 connects the first spline 4244 with the first motor 4240, thus the first motor 4240 drives the first spline 4244 through the first transmission unit 4242 and further drives the first passive unit 4206 of the inner shaft 4200 to rotate.

The second transmission module 426 is used for driving the second active unit 4222 of the magnetic coupling 420 to turn a second passive unit 4226 of the outer shaft 4220 by magnetic force. The second transmission module 426 includes a second motor 4260, at least one second transmission unit 4262, and at least one second spline 4264. The second transmission unit 4262 connects the second spline 4264 with the second motor 4260, thus the second motor 4260 drives the second spline 4264 through the second transmission unit 4262 and further drives the second passive unit 4226 of the outer shaft 4220 to rotate.

In practical applications, the above-mentioned transmission units can be a pulley set or a gear set, and the spline can be a ball spline, but not limited to this. Additionally, the first transmission module 424 and the second transmission module 426 can vary the design of the transmission unit based on the requirements or restrictions on space.

The third transmission module 428 is used for driving the magnetic coupling 420 and the carrier module 40 to move vertically. The third transmission module 428 includes a third motor 4280, at least one third transmission unit 4282 and a screw 4284. The third transmission unit 4282 connects the screw 4284 with the third motor 4280, thus the third motor 4280 drives the screw 4284 through the third transmission unit 4282 to make the magnetic coupling 420 and the carrier module 40 move along a vertical direction.

Figure 4A:
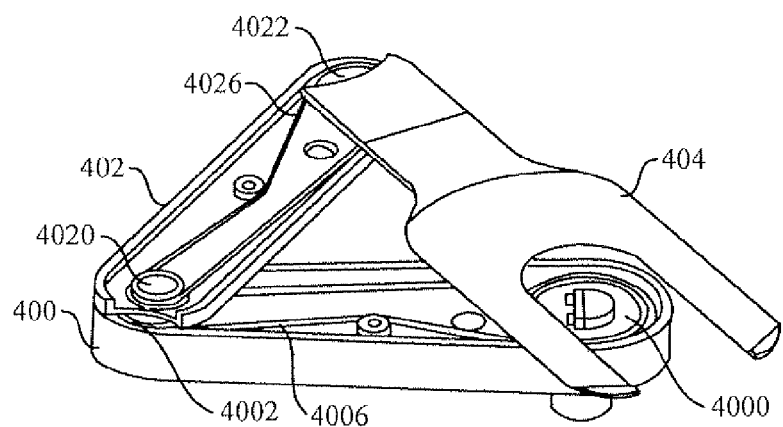
FIG. 4A shows a scheme diagram of the mechanism of the carrier module.
Figure 4B:
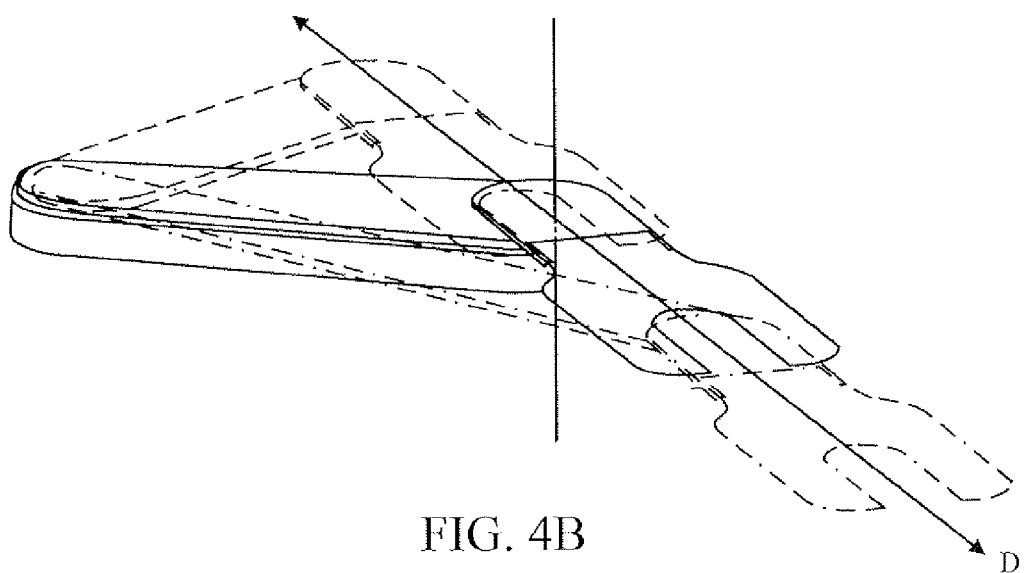
FIG. 4B shows a scheme diagram of the operation condition of the carrier module.

Please refer to FIG. 4A and FIG. 4B. FIG. 4A shows a scheme diagram of the mechanism of the carrier module 40; FIG. 4B shows a scheme diagram of the operation condition of the carrier module 40. The outer shaft 4220 is coupled to the lower arm 400; the inner shaft 4200 is coupled to a driving wheel 4000. The upper arm 402 is coupled to a passive wheel 4002, and driven by the driving wheel 4000 via a belt 4006. A driving wheel 4020 is coupled to the passive wheel 4002; the end effector 404 is coupled to a passive wheel 4022, and driven by the driving wheel 4020 via a belt 4026. As shown in the figure, when the inner shaft 4200 and the outer shaft 4220 are driven by the first transmission module 424 and the second transmission module 426 to rotate respectively, the carrier module 40 will be driven by the drive module 42 to achieve rotational or extending motion.

In practical applications, when the inner shaft 4200 and the outer shaft 4220 rotate at the same time, the components of the carrier module 40 will not generate relative movements, therefore, the carrier module 40 can perform a rotation movement over 360° corresponding to the center line of the drive module 42 without any angle limitations. For example, when an ordinary robotic arm rotates from 300° to 0°, the ordinary robotic arm should rotate 300° counterclockwise; however, since there is no maximum rotation angle limitation in this invention, the robotic arm of the invention does not need to rotate counterclockwise; the robotic arm can only rotate 60° clockwise to reach 360° (equal to 0°). In this way, the invention can perform minimum angle of rotation, thus enhance the efficiency of the robotic arm for transporting the substrate.

When the inner shaft 4200 keeps fixed and the outer shaft 4220 rotates, the upper arm 402 and the lower arm 400 will rotate relatively the same angle in opposite directions due to the constrain of the mechanism; similarly, the constrain of the mechanism also make the end effector 404 extend along a fixed direction D passing the center line of the drive module 42, so that the carrier module 40 can perform the extending motion, as shown in FIG. 4B.

Compared to the prior arts, the invention provides a robotic arm for transporting a substrate in an ultrahigh vacuum which can provides movements of three degrees of freedom including rotation, extension, and lifting. Since the inner shaft and the outer shaft of the magnetic coupling in the invention are coaxially designed, therefore, the motors can be set on the non-rotation component, and the magnetic coupling is driven through the spline by the motor, so that the robotic arm can perform the extension and the rotation without any angle limitations. Additionally, the invention uses magnetic coupling without any feedthrough shafts to obtain complete hermetic volume, so that the ultrahigh vacuum and cleanness can be assumed, and the reliability can be also increased and the maintaining time and cost can be also reduced.

Although the present invention has been illustrated and described with reference to the preferred embodiment thereof, it should be understood that it is in no way limited to the details of such embodiment but is capable of numerous modifications within the scope of the appended claims.

What is claimed is:

1. A robotic arm for transporting a substrate in an ultrahigh vacuum, comprising:
    a carrier module; and
    a drive module, coupled to the carrier module, comprising:
        a magnetic coupling, comprising
            an inner shaft and an outer shaft, driving the carrier module;
            a first active unit, embedded with a magnetic component (4204);
            a second active unit, with a magnetic component (4224);
            a first passive unit, with a magnetic component (4208) connected to the inner shaft;
            a second passive unit, with a magnetic component (4228) connected to the outer shaft; and
        a first transmission module, with a first transmission motor fixed on a bottom fixing mechanism and driving the first active unit of the magnetic coupling for magnetically turning the first passive unit of the inner shaft;
        a second transmission module, with a second transmission motor fixed on the bottom fixing mechanism and driving the second active unit of the magnetic coupling for magnetically turning the second passive unit of the outer shaft; and
        a third transmission module, with a third transmission motor fixed on the bottom fixing mechanism and driving the magnetic coupling for a vertical movement thereof;
    wherein the inner shaft and the outer shaft are driven, respectively, by the first transmission module and the second transmission module of the drive module, for driving the carrier module for a rotational or an extending motion.

2. The robotic arm of claim 1, wherein the drive module further comprises a diaphragm, as a non-magnetic separator placed between the first active unit and the first passive unit, and between the second active unit and the second passive unit.

3. The robotic arm of claim 2, wherein the first passive unit and the second passive unit are set on outer surfaces of the inner shaft and the outer shaft respectively.

4. The robotic arm of claim 2, further comprising a bellows, wherein the bellows is set between the diaphragm and an upper fixing mechanism.

5. The robotic arm of claim 1, wherein the first transmission module comprises a first transmission unit and a first spline, the first transmission unit connects the first spline with the first motor, for the first motor to drive the first spline through the first transmission unit and to further drive the inner shaft.

6. The robotic arm of claim 1, wherein the second transmission module comprises a second transmission unit and a second spline, the second transmission unit connects the second spline with the second motor, for the second motor to drive the second spline through the second transmission unit and to further drive the outer shaft.

7. The robotic arm of claim 1, wherein the third transmission module comprises a third transmission unit and a screw, the third transmission unit connects the screw with the third motor, for the third motor to drive the screw through the third transmission unit to move the carrier module vertically.

* * * * *